United States Patent
Ishikawa et al.

(10) Patent No.: US 11,607,746 B2
(45) Date of Patent: Mar. 21, 2023

(54) LASER DEVICE AND LASER PROCESSING DEVICE USING SAME

(71) Applicant: Panasonic Intellectual Property Management Co., Ltd., Osaka (JP)

(72) Inventors: Ryo Ishikawa, Osaka (JP); Shinya Domoto, Osaka (JP); Hideaki Yamaguchi, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 247 days.

(21) Appl. No.: 17/096,228

(22) Filed: Nov. 12, 2020

(65) Prior Publication Data
US 2021/0060696 A1    Mar. 4, 2021

Related U.S. Application Data

(63) Continuation of application No. PCT/JP2019/018824, filed on May 10, 2019.

(30) Foreign Application Priority Data

May 15, 2018 (JP) .............................. JP2018-093591

(51) Int. Cl.
*B23K 26/04* (2014.01)
*B23K 26/06* (2014.01)

(52) U.S. Cl.
CPC ........ *B23K 26/043* (2013.01); *B23K 26/0608* (2013.01); *B23K 26/0643* (2013.01)

(58) Field of Classification Search
CPC .............. H01S 5/4025; H01S 5/02251; H01S 5/06821; H01S 5/06825; H01S 5/02255;

(Continued)

(56) References Cited

U.S. PATENT DOCUMENTS

| 4,914,671 A | * | 4/1990 | Yagi | ........................ H01S 3/139 |
| | | | | 372/103 |
| 2005/0161445 A1 | * | 7/2005 | Ishii | ..................... B23K 26/043 |
| | | | | 356/152.1 |

(Continued)

FOREIGN PATENT DOCUMENTS

| JP | 62-177069 | 11/1987 |
| JP | 06-226478 | 8/1994 |

(Continued)

OTHER PUBLICATIONS

Examination Report dated Aug. 17, 2022 in corresponding Indian Patent Application No. 202047052304.

(Continued)

*Primary Examiner* — Eric S Stapleton
(74) *Attorney, Agent, or Firm* — Wenderoth, Lind & Ponack, L.L.P.

(57) ABSTRACT

A laser device includes a laser oscillator configured to emit a laser beam, and an optical unit configured to receive the laser beam and emit the laser beam outside. The optical unit includes: a partially transmissive mirror configured to reflect a part of the laser beam toward the outside and transmit a remaining part of the laser beam; a diffusion plate configured to diffuse the laser beam which has passed through the partially transmissive mirror and deflect the laser beam in a predetermined direction, at a predetermined diffusion angle; and a photodiode configured to receive the laser beam deflected by the diffusion plate, and output an electric signal. The laser device is configured such that deviation of an optical axis of the laser beam is monitored based on the electric signal of the photodiode.

8 Claims, 5 Drawing Sheets

(58) Field of Classification Search
CPC .... H01S 5/0683; H01S 5/4012; H01S 5/0014; B23K 26/0608; B23K 26/043; B23K 26/0643
USPC .................................................. 219/121.79
See application file for complete search history.

(56) References Cited

U.S. PATENT DOCUMENTS

| | | | | |
|---|---|---|---|---|
| 2009/0003402 | A1* | 1/2009 | Nunen | H01S 3/09415 |
| | | | | 372/75 |
| 2015/0268040 | A1* | 9/2015 | Izumi | B23K 26/032 |
| | | | | 356/399 |
| 2017/0070031 | A1* | 3/2017 | Takigawa | H01S 5/06216 |
| 2017/0133819 | A1* | 5/2017 | Takigawa | H01S 5/0021 |

FOREIGN PATENT DOCUMENTS

| | | |
|---|---|---|
| JP | 9-271971 | 10/1997 |
| JP | 2000-094172 | 4/2000 |
| JP | 2006-317702 | 11/2006 |
| JP | 2010-264461 | 11/2010 |
| JP | 2015-182104 | 10/2015 |
| JP | 2017-92206 | 5/2017 |

OTHER PUBLICATIONS

International Search Report dated Jun. 11, 2019 in International (PCT) Application No. PCT/JP2019/018824 with English translation.
Extended European Search Report dated Jun. 22, 2021 in corresponding European Patent Application No. 19802633.8.

* cited by examiner

LASER DEVICE AND LASER PROCESSING DEVICE USING SAME

CROSS-REFERENCE TO RELATED APPLICATIONS

This is a continuation of International Application No. PCT/JP2019/018824 filed on May 10, 2019, which claims priority to Japanese Patent Application No. 2018-093591 filed on May 15, 2018. The entire disclosures of these applications are incorporated by reference herein.

BACKGROUND

The present invention relates to a laser device and a laser processing device using the same.

In recent years, so-called laser processing has been used to process various members where a workpiece is processed by using a laser processing device having a high-output laser oscillator. However, there may arise a fear that the optical axis of a laser beam deviates in the laser processing device due to, for example, vibrations of surrounding machinery. Deviation of the optical axis in this manner may lead to, for example, damage on a transmission fiber guiding the laser beam, or faulty processing resulting from displacement between a set processing position and an actual processing position.

Thus, various techniques for monitoring the deviation of the optical axis of the laser beam have been proposed. For example, Japanese Unexamined Patent Publication No. 2015-182104 discloses a half mirror reflecting a laser beam toward a workpiece. The half mirror has a laser beam projecting surface on a back side of which a sensor is arranged to directly receive a laser beam passing through the half mirror in case of deviation of the optical axis of the laser beam.

SUMMARY

However, the sensor disclosed in Japanese Unexamined Patent Publication No. 2015-182104 is a heat detecting sensor such as a thermocouple or a thermostat, which detects heat generated upon absorption of a laser beam. This may disadvantageously lead to a delay in response until increase in temperature, and false detection of heat generated around the sensor during continuous oscillation. Therefore, the sensor is incapable of accurately detecting whether or not the optical axis of the laser beam deviates. Further, the invention of Japanese Unexamined Patent Publication No. 2015-182104 involves a complicated structure because, for example, a shielding plate shielding the laser beam has to be disposed on the back side of the half mirror or the sensor has to be thermally separated from the shielding plate. Further, in a configuration in which the laser beam emitted from the laser oscillator is guided to a laser beam emitting head via a transmission fiber, the detection of deviation between the optical axis of the laser beam and a core of the transmission fiber is critical. However, the sensor stated above can hardly detect this deviation.

The present invention has been made in view of the above problems, and an object thereof is to provide a laser device having a simple structure and being capable of detecting whether or not the optical axis of the laser beam deviates, as well as a laser processing device using the same.

In order to achieve the above object, the laser device of the present invention includes: a laser oscillator emitting a laser beam; and an optical unit receiving the laser beam emitted from the laser oscillator and emitting the laser beam to outside. The optical unit includes: a partially transmissive mirror reflecting a part of the laser beam toward the outside while transmitting a remaining part of the laser beam; a light deflecting member diffusing a laser beam passed through the partially transmissive mirror and deflecting the laser beam in a predetermined direction, at a predetermined diffusion angle; and a light receiver receiving the laser beam deflected by the light deflecting member and outputting an electric signal. Deviation of an optical axis of the laser beam is monitored based on an output signal of the light receiver.

According to this configuration, the laser beam is deflected by the light deflecting member at the predetermined diffusion angle and received by the light receiver. Accordingly, it is possible to increase the rate of change of light receiving sensitivity with respect to the deviation of the optical axis of the laser beam. In this way, with a simple configuration, it is possible to detect whether the optical axis of the combined laser beam deviates.

Further, a laser processing device of the present invention includes at least: the laser device mentioned above; a transmission fiber that is connected to the laser device and guides a laser beam emitted from the laser device; and a laser beam emitting head attached to an emission end of the transmission fiber.

According to this configuration, it is possible to reduce the risk of damage on the laser device and the transmission fiber, and reduce the risk of, for example, occurrence of erroneous laser processing during the laser processing or poor processing quality.

According to the laser device of the present invention, with a simple configuration, it is possible to detect whether or not the optical axis of a laser beam deviates. Further, according to the laser processing device of the present invention, the cause of decrease in output of the laser beam may be easily determined, resulting in an improved productivity.

DETAILED DESCRIPTION

Embodiments of the present invention will be described in detail with reference to the drawings. The following description of advantageous embodiments is a mere example in nature, and is not at all intended to limit the scope, applications or use of the present invention.

First Embodiment

[Configuration of Laser Processing Device and Internal Configuration of Beam Combiner]

Figure 1:
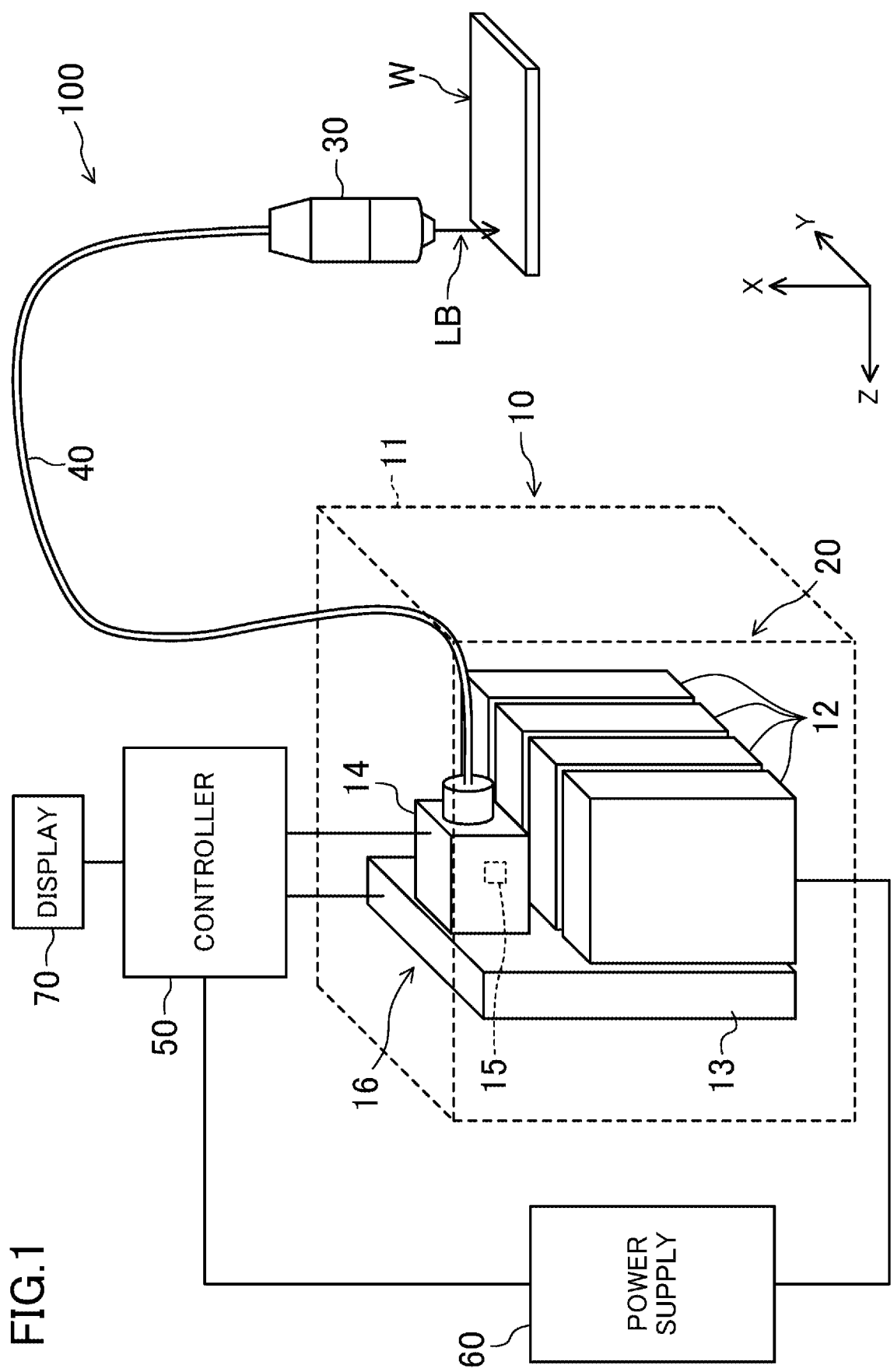
FIG. 1 is a schematic view illustrating a configuration of a laser processing device of a first embodiment of the present invention.
Figure 2:
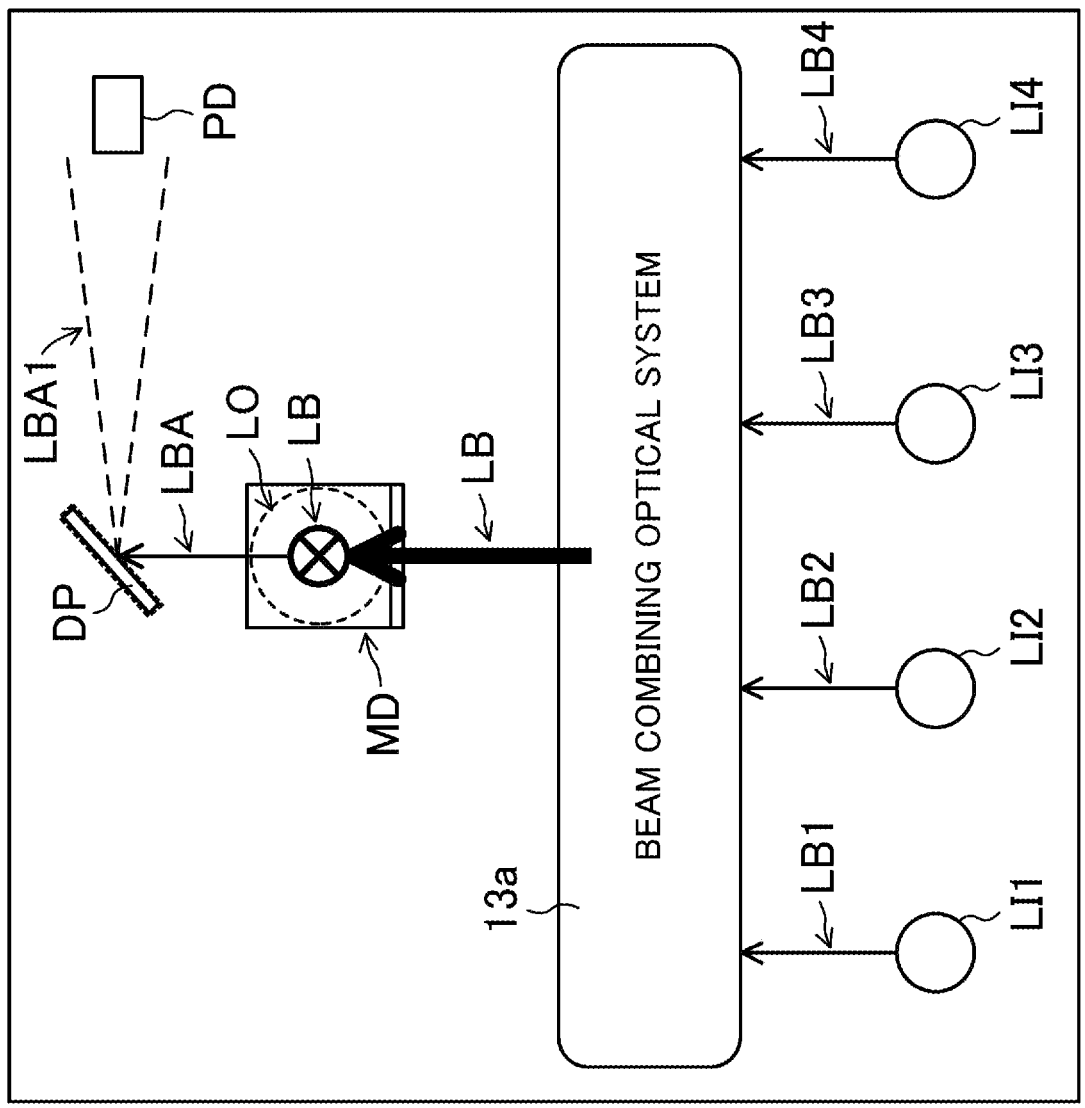
FIG. 2 is a schematic view illustrating an internal configuration of a beam combiner.

FIG. 1 is a schematic view illustrating a configuration of a laser processing device of the present embodiment. FIG. 2 is a schematic view illustrating an internal configuration of a beam combiner. Note the following: In the following description, a propagation direction in which the laser beam enters the beam combiner 13 from a laser oscillator 20 shown in FIG. 1 may be referred to as a "Z direction", an arrangement direction of laser modules 12 may be referred to as a "Y direction", and a direction orthogonal to the Y direction and the Z direction may be referred to as an "X direction".

The laser processing device 100 includes a laser device 10, a laser beam emitting head 30, a transmission fiber 40, a controller 50, a power supply 60, and a display 70. The laser device 10 and an end of the transmission fiber 40 into which a laser beam enters (hereinafter, simply referred to as an "incident end." Further, an end of the transmission fiber 40 from which the laser beam is emitted will be simply referred to as an "emission end.") are housed in a casing 11.

The laser device 10 includes the laser oscillator 20 including the plurality of laser modules 12, the beam combiner 13, and a light condensing unit 14. Note the following: In the following description, the beam combiner 13 and the light condensing unit 14 may be collectively referred to as an optical unit 16.

The laser modules 12 each include a plurality of laser diodes or laser arrays which emit laser beams having different wavelengths. The laser beams are wavelength-synthesized in the laser modules 12 and emitted from the laser modules 12. The laser beams emitted from the laser modules 12 are combined by using the beam combiner 13 into a single laser beam (hereinafter referred to as a "combined laser beam LB"). Specifically, optical axes of the laser beams are brought close to each other or made to agree with each other so that the laser beams are combined to be parallel to each other. Further, the combined laser beam LB is condensed by using a light condensing lens (not shown) disposed in the light condensing unit 14, and subject to reduction of its beam diameter to a predetermined magnification, entering the transmission fiber 40. Such configuration of the laser device 10 enables to obtain the laser processing device 100 emitting a laser beam having a high output power exceeding several kW. Further, the laser device 10 is supplied with electric power from the power supply 60 to perform laser oscillation. Then, the combined laser beam LB is emitted from the emission end of the transmission fiber 40. According to the present embodiment, the laser oscillator 20 includes four laser modules 12, but the laser oscillator 20 is not limited to this configuration. The number of mounted laser modules 12 may be appropriately changed depending on, for example, output specifications required by the laser processing device 100 or output specifications of each laser module 12.

The beam combiner 13 includes therein, a beam combining optical system 13a, a mirror MD, a diffusion plate DP that is a light deflecting member, and a photodiode PD that is a light receiver. Although not shown, the beam combining optical system 13a includes a plurality of optical components such as a mirror (not shown) and a polarizing beam splitter (not shown) for combining the laser beams LB1 to LB4 respectively incident from laser beam incident portions LI1 to LI4.

The mirror MD is a partially transmissive mirror configured to reflect most of the combined laser beam LB combined by using the beam combining optical system 13a toward the laser beam emission portion LO, and to transmit a remaining part of the laser beam LB. In the present embodiment, the reflectance and transmittance of the mirror MD with respect to the combined laser beam LB are set to, although not limited, 99.99% and 0.01%, respectively. The reflectance of the mirror MD may be appropriately changed depending on, for example, the maximum output of the combined laser beam LB, or the performance of the photodiode PD described later.

The diffusion plate DP is a light deflecting member. When a part of the combined laser beam (hereinafter referred to as a "monitoring laser beam LBA") that has passed through the mirror MD enters the diffusion plate DP, the diffusion plate DP deflects, at a predetermined diffusion angle, the part of the laser beam toward a light receiving surface PDa of the photodiode PD (see FIG. 3A). Note the following: In the following description, the monitoring laser beam LBA that has been deflected by the diffusion plate DP may be referred to as a "monitoring laser beam LBA1." Further, the light distribution characteristics of the diffusion plate DP, including the diffusion angle, may be appropriately changed. For example, the characteristics may be appropriately changed depending on, for example, intensity of the monitoring laser beam LBA, a distance between the diffusion plate DP and the photodiode PD, or a size of the light receiving surface PDa. When the optical axis of the combined laser beam LB in the laser device 10 is at a predetermined position, the diffusion plate DP is disposed in the beam combiner 13 so as to form an angle of 45° respectively with the optical axis of the monitoring laser beam LBA and with the optical axis of the monitoring laser beam LBA1.

The photodiode PD is a light receiver that receives, on the light receiving surface PDa, the monitoring laser beam LBA1 deflected by the diffusion plate DP, and outputs an electric signal. The value of the electric signal depends on an amount of light received by the light receiving surface PDa. In the present embodiment, the output signal of the photodiode PD and the amount of light received by the photodiode PD are made to be proportional. Further, the output signal of the photodiode PD is input to the controller 50 (see FIG. 1) and used to monitor deviation of the optical axis of the combined laser beam LB.

The light condensing unit 14 includes a light condensing lens (not shown). The light condensing lens condenses the combined laser beam LB such that the beam has, at the incident end of the transmission fiber 40, a spot diameter smaller than a core diameter of a core (not shown) of the incident end of the transmission fiber 40. Further, the light condensing unit 14 has a connector (not shown) to which the incident end of the transmission fiber 40 is connected. Note that the light condensing unit 14 includes an output monitor 15 for monitoring the output of the combined laser beam LB.

The transmission fiber 40 is optically coupled to the light condensing lens of the light condensing unit 14 and guides the combined laser beam LB received from the laser device 10 via the light condensing lens to the laser beam emitting head 30. Although not shown, the transmission fiber 40 includes, in its axial center, a core for guiding the combined laser beam LB, and a cladding that is in contact with the outer circumferential surface of the core and has a refractive index lower than that of the core. The cladding serves to trap the combined laser beam LB in the core. Further, the outer circumferential surface of the cladding is covered with a film (not shown) for shielding against external light and providing protection from mechanical damage.

The laser beam emitting head 30 projects the combined laser beam LB guided by the transmission fiber 40 toward the outside. For example, in the laser processing device 100 shown in FIG. 1, the combined laser beam LB is emitted toward a workpiece W that is a processing object disposed in a predetermined position. In this way, the workpiece W is subject to laser processing.

The controller 50 controls laser oscillation of the laser oscillator 20. Specifically, the controller 50 performs laser oscillation control of each laser module 12 by delivering a control signal such as an output voltage or an ON time to the power supply 60 connected to the laser oscillator 20. The laser oscillation control may also be performed separately on each of the laser modules 12. For example, it is possible to set the laser oscillation output, the ON time or the like differently for each of the laser modules 12. Further, the controller 50 receives the output signal from the photodiode PD disposed in the beam combiner 13 and calculates, based on the output signal, light intensity distribution of the monitoring laser beam LBA1 on the light receiving surface PDa. Further, the output of the combined laser beam LB is calculated based on an output signal from the output monitor 15 in the light condensing unit 14. Note that the output of the combined laser beam LB may be calculated based on the output signal from the photodiode PD. Further, the controller 50 may control operation of a manipulator (not shown) to which the laser beam emitting head 30 is attached.

As described above, the power supply 60 supplies electric power for performing the laser oscillation to the laser oscillator 20, specifically to each of the plurality of laser modules 12. Depending on a command from the controller 50, it is possible to supply electric power differently to each of the laser modules 12. Further, the power supply 60 may supply electric power to a moving element of the laser processing device 100, for example, the above-mentioned manipulator. Alternatively, a separate power supply (not shown) may be provided to supply the moving element of the laser processing device 100 with electric power.

The display 70 is configured to display light intensity distribution of the monitoring laser beam LBA1 calculated by the controller 50. Further, the output of the combined laser beam LB calculated by the controller 50 may be displayed based on the output signal from the output monitor 15 or the output signal from the photodiode PD. Note that the display 70 may display data other than the output of the laser beam. For example, processing parameters and actual measured values during laser processing may be displayed simultaneously. The display 70 typically includes a display device such as a cathode ray tube or a liquid crystal display.

Next, a method for monitoring deviation of the optical axis of the combined laser beam LB will be described.

Figure 3A:
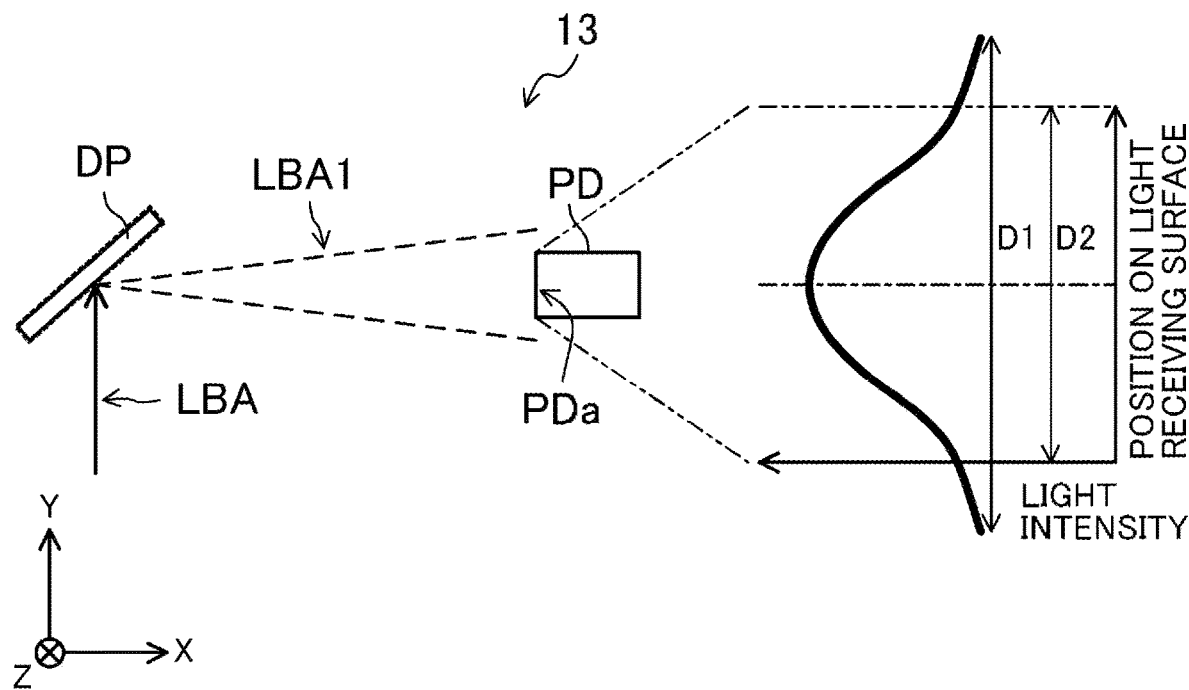
FIG. 3A is a diagram illustrating a state of light entering a light receiver and light intensity distribution on a light receiving surface of the first embodiment in a case in which an optical axis of a combined laser beam does not deviate.
Figure 3B:
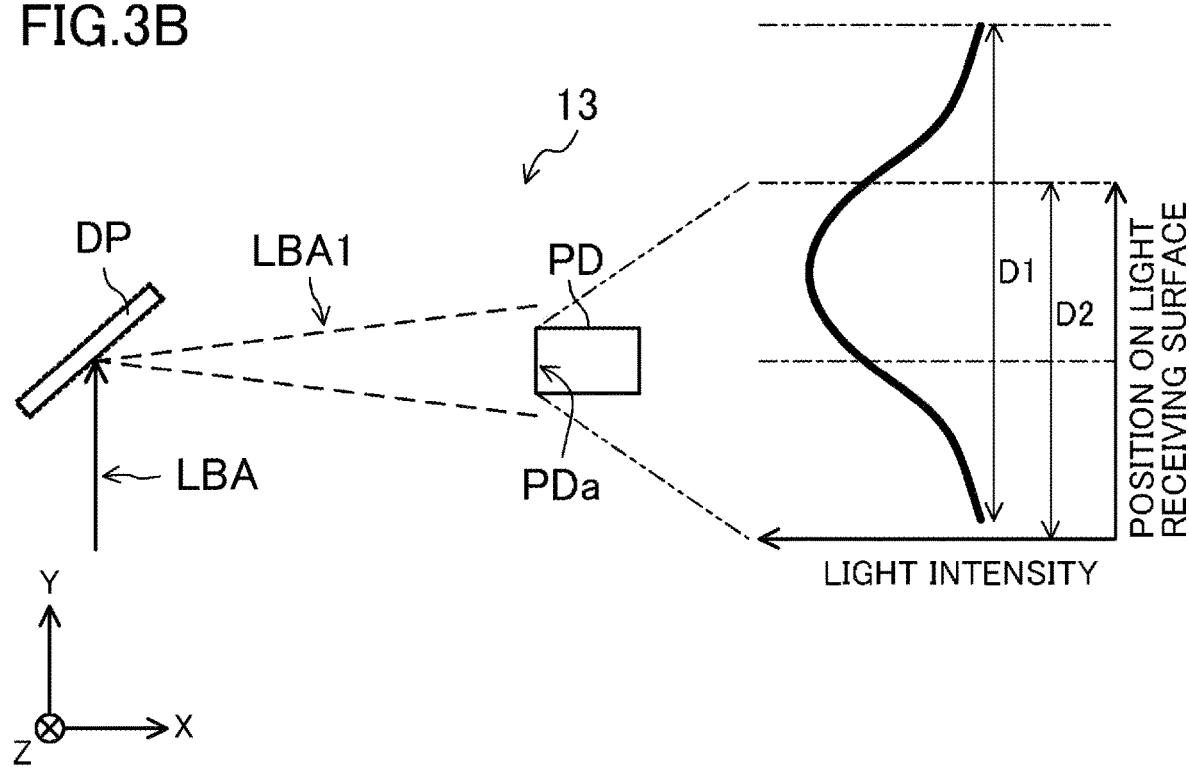
FIG. 3B is a diagram illustrating a state of light entering the light receiver and light intensity distribution on the light receiving surface of the first embodiment in a case in which the optical axis of the combined laser beam deviates.

FIG. 3A is a diagram illustrating the state of light entering a light receiver and light intensity distribution on a light receiving surface of the first embodiment in a case in which an optical axis of the combined laser beam LB does not deviate. FIG. 3B shows a case in which an optical axis of the combined laser beam LB deviates.

As shown in FIGS. 3A and 3B, the monitoring laser beam LBA1 deflected by the diffusion plate DP enters the light receiving surface PDa of the photodiode PD while spreading at a predetermined diffusion angle, and. Here, the light distribution characteristics of the diffusion plate DP and the distance between the diffusion plate DP and the photodiode PD are set such that a half value width D1 of the monitoring laser beam LBA1 that has reached the light receiving surface PDa is larger than the light receiving surface PDa. Note that the half value width D1 and a width D2 of the light receiving surface PDa may be the same.

As shown in FIG. 3A, in a case in which the optical axis of the combined laser beam LB does not deviate, that is, in a case in which the combined laser beam LB emitted from the beam combiner 13 enters the core of the transmission fiber 40 via the light condensing unit 14, the monitoring laser beam LBA1 is adjusted to have a light intensity peak that falls substantially at a center of the light receiving surface PDa. Further, the right part in FIG. 3A shows a diagram illustrating the relation between the position on the light receiving surface PDa and the light intensity of the monitoring laser beam LBA1. In this diagram, the area of a lower side of a light intensity curve corresponds to the amount of light of the monitoring laser beam LBA1 to be received by the photodiode PD. As described above, since the transmittance of the combined laser beam LB through the mirror MD is fixed, the above-mentioned area is proportional to the output of the combined laser beam LB.

On the other hand, as shown in FIG. 3B, in a case in which the optical axis of the combined laser beam LB deviates, that is, in a case in which the combined laser beam LB leaks from the core of the transmission fiber 40 and enters the cladding at a predetermined ratio, the monitoring laser beam LBA1 enters the photodiode PD with the light intensity peak shifting from the center of the light receiving surface PDa. In this case, the amount of light of the monitoring laser beam LBA1 shown in FIG. 3B is smaller than the amount of light in the case shown in FIG. 3A. This indicates that the amount of light of the monitoring laser beam LBA1 to be received by the photodiode PD, in other words, the output signal of the photodiode PD, corresponds to the degree of deviation of the optical axis of the combined laser beam LB. That is, the deviation of the optical axis of the combined laser beam LB may be estimated based on the output signal of the photodiode PD. Further, in a case in which the output of the combined laser beam LB is monitored based on the output signal from the photodiode PD, the output of the combined laser beam LB is estimated as lower than the actual output due to the deviation of the optical axis of the combined laser beam LB.

According to the configuration of the present embodiment, a test etc. is performed beforehand to obtain the amount of light in a case in which the optical axis of the combined laser beam LB does not deviate and the amount of light in a case the optical axis of the combined laser beam LB deviates, i.e., to obtain the output of the photodiode PD. Then, the deviation of the optical axis of the laser beam is monitored by monitoring the output of the combined laser beam LB based on the output signal of the photodiode PD.

Further, the output signal of the photodiode PD thus monitored is compared with the output signal of the photodiode PD in a case in which the optical axis of the combined laser beam LB obtained beforehand, determining the degree of decrease in output to determine whether or not the deviation of the optical axis of the combined laser beam LB is good.

For monitoring the deviation of the optical axis of the combined laser beam LB, the diffusion plate DP is used to diffuse the monitoring laser beam LBA at a predetermined diffusion angle and let the monitoring laser beam LBA enter the photodiode PD. Accordingly, it is possible to increase the rate of change in light receiving sensitivity of the photodiode PD with respect to the deviation of the optical axis of the combined laser beam LB. For example, the output signal of the photodiode PD of the present embodiment varies by 10% as the output of the combined laser beam LB varies by 1%. In other words, the variation of the combined laser beam LB by 1% is decupled, resulting in the variation of the output signal of the photodiode PD by 10%. Accordingly, a more stable detection of the deviation of the optical axis is possible. In this way, the following setting is provided: Compared with a case in which the optical axis of the combined laser beam LB does not deviates, in a case in which the deviation of the optical axis of the combined laser beam decreases by, for example, more than 3%, i.e., in a case in which the output signal of the photodiode PD, which corresponds to the deviation of the optical axis of the combined laser beam LB, decreases by more than 30%, which is obtained by decupling 3% as mentioned above, the laser oscillation of the laser oscillator 20 stops. However, the ratio of decrease of the signal of the photodiode PD in a case in which the laser oscillation stops is not limited to the above, and may be appropriately changed depending on the size of the laser device 10, the core diameter of the transmission fiber 40, the beam diameter of the combined laser beam LB, or the like. Further, a warning sound may be sent to an operator before the laser oscillation stops, and a warning screen may be displayed on the display 70. The amount of light, in other words, the output signal of the photodiode PD, in a case in which the optical axis of the combined laser beam LB does not deviate may be set to a predetermined allowable value or to a value within a predetermined allowable range in a case in which the optical axis of the combined laser beam LB does not deviate.

[Advantages]

As described above, the laser device 10 of the present embodiment includes the laser oscillator 20 that emits laser beams, and the optical unit 16 that receives the laser beams emitted from the laser oscillator 20 and emits them to the outside. Further, the laser oscillator 20 includes a plurality of laser modules 12 emitting laser beams.

The optical unit 16 includes the beam combiner 13 and the light condensing unit 14. The beam combiner 13 combines the plurality of laser beams emitted from the plurality of laser modules 12 and emits the plurality of laser beams as the combined laser beam LB. The light condensing unit 14 condenses the combined laser beam LB and emits the combined laser beam LB to the outside, in this case, to the incident end of the transmission fiber 40.

The beam combiner 13 includes the mirror MD, the diffusion plate DP, and the photodiode PD. The mirror MD is a partially transmissive mirror reflecting the combined laser beam LB toward the light condensing unit 14 and transmitting the monitoring laser beam LBA. The diffusion plate DP is a light deflecting member diffusing the monitoring laser beam LBA that has passed through the mirror MD and deflecting it in a predetermined direction, at the predetermined diffusion angle. The photodiode PD is a light receiver receiving the monitoring laser beam LBA1 deflected by the diffusion plate DP and outputting the electric signal. The deviation of the optical axis of the combined laser beam LB is monitored based on the output signal of the photodiode PD.

According to the present embodiment, with a simple configuration in which the monitoring laser beam LBA that has passed through the partially transmissive mirror MD is spread by the diffusion plate DP at a predetermined diffusion angle and received by the photodiode PD, it is possible to detect whether or not the optical axis of the combined laser beam LB deviates. Further, this configuration of the laser device 10 enables to easily determine the cause of failure of the laser device 10 with a simple configuration. As described above, in case of decrease in output of the laser device 10, it has been unclear whether this results from a defect in laser modules 12, abnormal supply of electric power from the power supply 60 to the laser modules 12, or a positional displacement of the optical components in the optical unit 16. Therefore, in the laser processing device 100, in a case in which the output of the laser beam decreased to a predetermined ratio or lower, it has been necessary to stop the laser oscillation, and inspect all components to determine the cause of failure. However, these operations have required a lot of efforts, and the downtime of the laser processing device 100 has increased, resulting in a decrease in productivity.

On the other hand, according to the present embodiment, it is possible to reliably detect whether or not the optical axis of the combined laser beam LB deviates. This will be described below in detail.

Figure 4A:
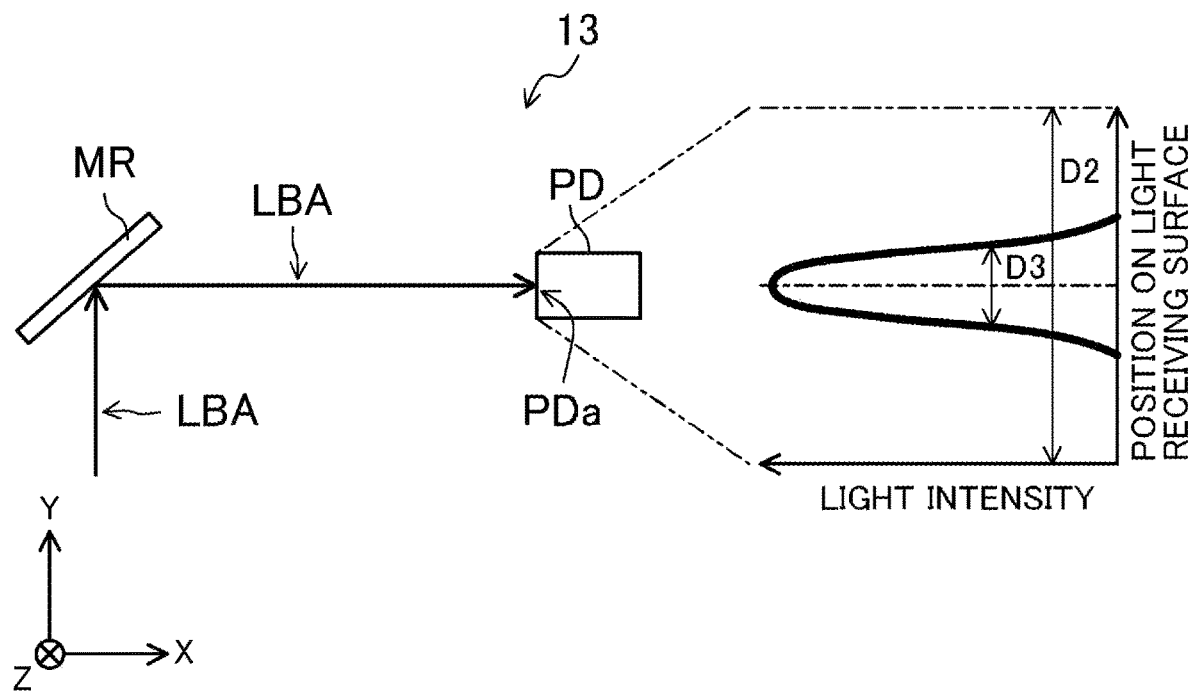
FIG. 4A is a diagram illustrating a comparative example of a state of light entering a light receiver and light intensity distribution on a light receiving surface in a case in which an optical axis of a combined laser beam does not deviate.

FIG. 4A is a diagram illustrating a comparative example of the state of light incident on a light receiver and light intensity distribution on a light receiving surface in a case in which an optical axis of a combined laser beam does not deviate. Further, FIG. 4B is a diagram illustrating a comparative example of the state of light incident on the light receiver and the light intensity distribution on the light receiving surface in a case in which the optical axis of the combined laser beam deviates.

Figure 4B:
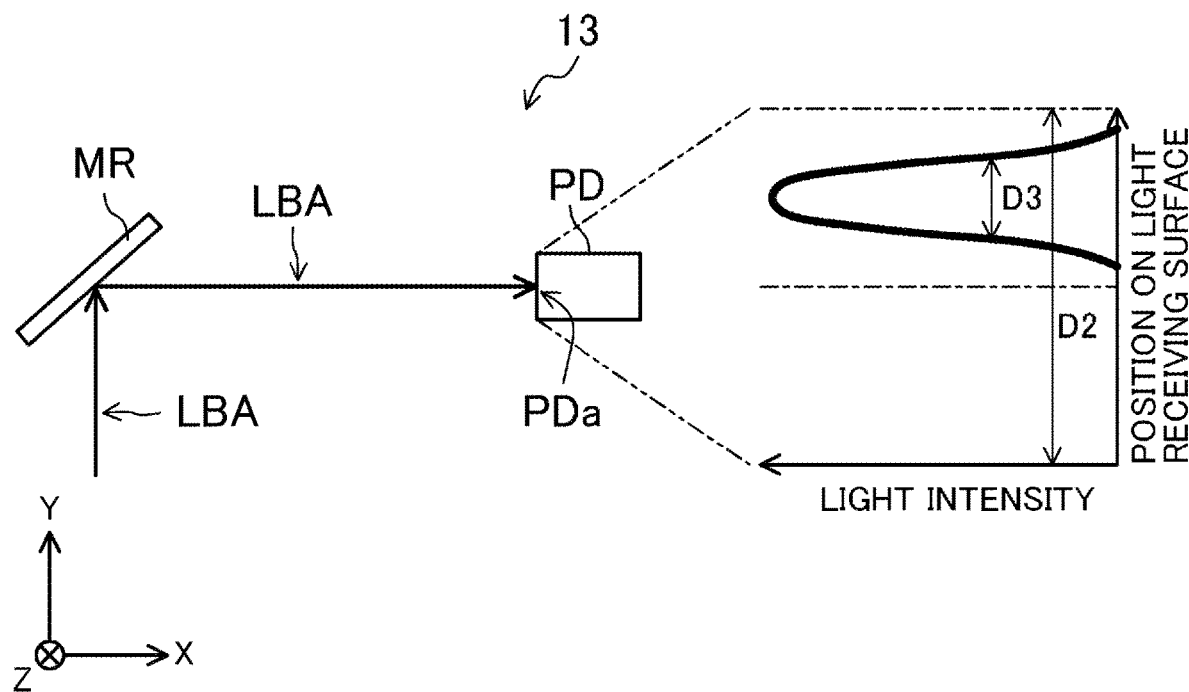
FIG. 4B is a diagram illustrating the comparative example pf a state of light entering the light receiver and light intensity distribution on the light receiving surface in a case in which the optical axis of the combined laser beam deviates.

The configurations shown in FIGS. 4A and 4B are different from those shown in FIGS. 3A and 3B in that the diffusion plate DP is replaced with a mirror MR. The mirror MR makes the monitoring laser beam LBA enter the light receiving surface PDa of the photodiode PD without diffusing the beam incident on the mirror MR, that is, without changing the spread of the beam.

As apparent from FIGS. 4A and 4B, in a case in which the optical axis of the combined laser beam LB deviates, the position of the light intensity peak of the monitoring laser beam LBA on the light receiving surface PDa shifts. However, a half value width D3 of the monitoring laser beam LBA on the light receiving surface PDa is smaller than the half value width D1 of the monitoring laser beam LBA1 in a case in which the diffusion plate DP is used, and is smaller than the width D2 of the light receiving surface PDa. Therefore, even if the optical axis of the combined laser beam LB deviates, the total amount of light of the monitoring laser beam LBA1 received by the photodiode PD, in other words, the width D2 of the light receiving surface PDa of the photodiode PD hardly changes. Therefore, it is impossible to detect, from the output signal of the photodiode PD, whether or not the optical axis of the combined laser beam LB deviates.

Further, in the present embodiment, the spot-like shape of the combined laser beam LB is a substantially rectangular shape having dimensions of approximately 100 μm in both the longitudinal and lateral directions. The spot-like shape is set to be equal to the core diameter of the transmission fiber 40. Further, when the output of the combined laser beam LB emitted from the emission end of the transmission fiber 40 decreases by more than 3% with respect to the normal value, the amount of light of the laser beam entering the cladding exceeds a predetermined value, and the transmission fiber 40 gets damaged. Under such conditions, it has been impossible to determine whether the output fluctuation of the combined laser beam LB was caused by deviation of the optical axis or by an abnormality of the laser oscillator 20, even though the output of the combined laser beam LB was monitored at the emission end of the transmission fiber 40 or at the output monitor 15 in the light condensing unit 14. This was because the detection sensitivity is too weak so that the output fluctuation of the combined laser beam LB could not be detected.

On the other hand, according to the present embodiment, the monitoring laser beam LBA is diffused at a predetermined diffusion angle by using the diffusion plate DP disposed in the beam combiner 13 before the monitoring laser beam LBA enters the photodiode PD. Accordingly, the rate of change of the light receiving sensitivity of the photodiode PD may increase with respect to the deviation of the optical axis of the combined laser beam LB. For example, when the output of the combined laser beam LB varies by 1%, the output signal of the photodiode PD of the present embodiment varies by 10%, which is obtained by decupling 1%, in response to the deviation of the optical axis of the combined laser beam LB. In this way, it is possible to detect whether or not the optical axis of the combined laser beam LB deviates.

Further, in combination with the output monitor 15 of the light condensing unit 14, it is possible to easily and reliably determine defect locations in the laser device 10.

For example, if the comparison of the output value of the output monitor 15 with the output value of the photodiode PD in the beam combiner 13 reveals that the output value of the output monitor 15 of the light condensing unit 14 and the output value of the photodiode PD in the beam combiner 13 are within a set predetermined range, it is possible to determine that the laser device 10 functions normally. On the other hand, if the output value of the output monitor 15 of the light condensing unit 14 and the output value of the photodiode PD in the beam combiner 13 are out of the set predetermined range, it is possible to determine that a defect of the laser oscillator 20 occurs. Then, the connection between the power supply 60 and the laser modules 12 is checked and each of the laser modules 12 is checked. After that, the defect is fixed by replacing the laser module 12, if necessary. In addition, if the output value of the output monitor 15 of the light condensing unit 14 is within the predetermined range, whereas the output value of the photodiode PD in the beam combiner 13 is out of the predetermined range, it is possible to determine that a positional displacement of an optical component in the beam combiner 13 occurs. Accordingly, the defect may be fixed by replacing the beam combiner 13, or by positionally adjusting the optical components in the beam combiner 13.

Note that the defect location may be determined based only on the output value of the photodiode PD. As described above, when the output of the combined laser beam LB varies by 1%, the output value of the photodiode PD varies by 10%, which is obtained by substantially decupling 1%, in response to the deviation of the optical axis of the combined laser beam LB. Consequently, if output variation of the photodiode PD is 10% to 20%, the positional displacement of the optical component in the beam combiner 13 may be set to be checked first, and if the output variation of the photodiode PD exceeds 20%, it may be possible to determine whether or not an abnormality in the laser oscillator 20 exists.

In either case, the laser oscillator 20 is configured to stop in a case in which the output signal of the photodiode PD decreases by a predetermined ratio or more with respect to the output signal in the case in which the optical axis of the combined laser beam LB does not deviate.

In this way, in a case the optical axis of the combined laser beam LB has deviated, this deviation may be detected as soon as possible, which enables to reduce the risk of damage of the laser device 10 and the transmission fiber 40, and to reduce the risk of occurrence of a failure during the laser processing or poor processing quality.

The laser processing device 100 of the present embodiment includes at least the laser device 10, the transmission fiber 40 that is connected to the laser device 10 and guides the combined laser beam LB emitted from the laser device 10, and the laser beam emitting head 30 that is attached to the emission end of the transmission fiber 40.

This configuration of the laser processing device 100 enables to quickly determine a defect of the laser device 10 and to take a countermeasure against the defect locations. Thus, it is possible to shorten the downtime and improve productivity. Further, the combined laser beam LB whose optical axis deviates or whose output decreases is not emitted to the workpiece W. Thus, it is possible to reduce the risk of occurrence of faulty processing of the workpiece W and maintain processing quality.

Second Embodiment

Figure 5:
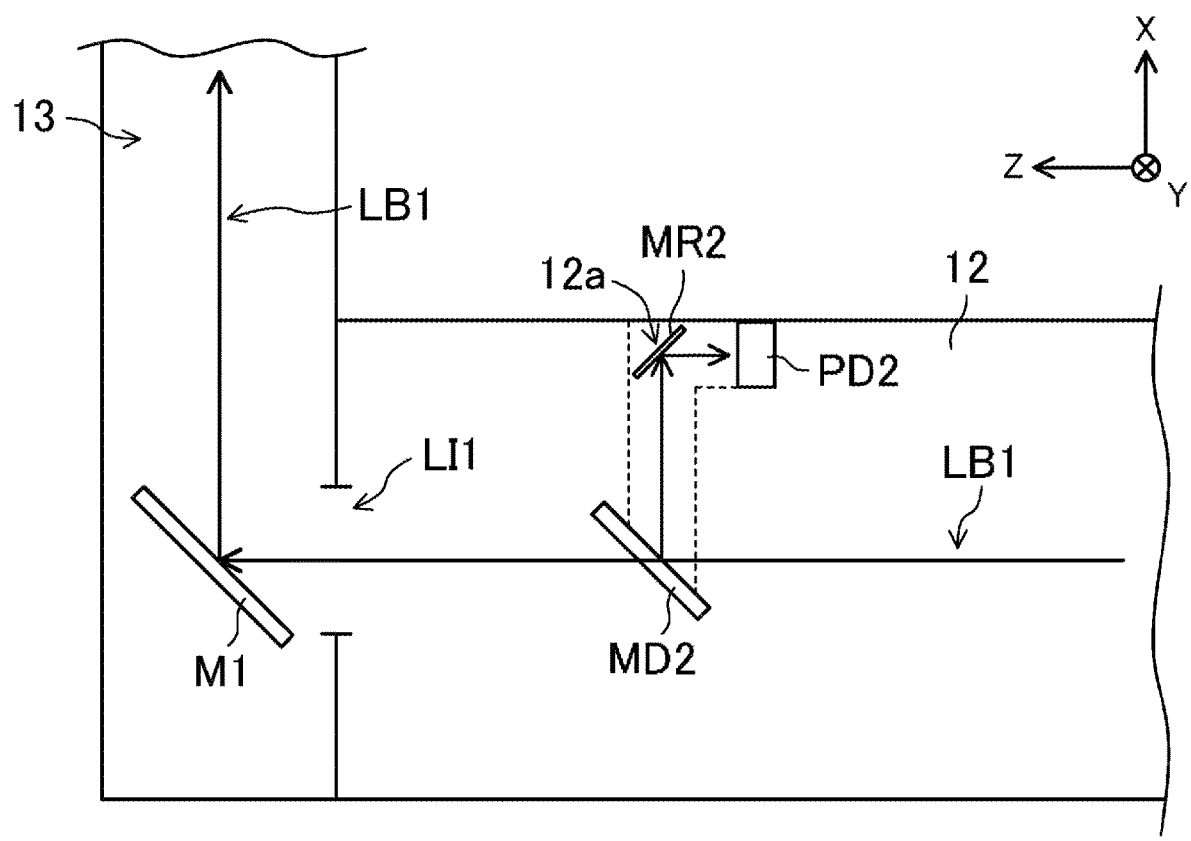
FIG. 5 is a schematic view illustrating an internal configuration of a laser module of a second embodiment of the present invention.

FIG. 5 is a schematic view illustrating an internal configuration of a laser module of the present embodiment. The laser processing device 100 and the laser device 10 of the present embodiment have the same configurations as those of the first embodiment, except for the internal configuration of each of the laser modules 12 shown in FIG. 5. Therefore, for the present embodiment, the drawings and description of configurations except for the internal configuration of each of the laser modules 12 are omitted.

As shown in FIG. 5, each of the laser modules 12 of the present embodiment has a partially reflective mirror MD2, an optical waveguide 12a, and a photodiode (a separate light receiver) PD2. The partially reflective mirror MD2 transmits most of the laser beam to the inside and directs it toward a mirror M1, while reflecting a remaining part of the laser beam toward the optical waveguide 12a. The optical waveguide 12a guides the laser beam reflected by the partially reflective mirror MD2 toward the photodiode PD2. The photodiode PD2 receives the laser beam reflected by a mirror MR2 inside the optical waveguide 12a. These components are arranged for each of the laser modules 12.

This configuration of each of the laser modules 12 enables to monitor the respective laser beams output from the laser modules 12. Further, use of output values monitored in the laser modules 12 makes it possible to more reliably determine a defect location in the laser device 10. For example, if the comparison of the output value of the photodiode PD2 in the laser module 12 with the output value of the photodiode PD in the beam combiner 13 reveals that both the output value of the photodiode PD2 and the output value of the photodiode PD are within the set predetermined range, it is possible to determine that the laser device 10 functions normally. On the other hand, if one of the output value among the output values of the photodiodes PD2 is out of the predetermined range, it is possible to determine that a defect occurs in the corresponding laser module 12. Then, the connection between the power supply 60 and the laser module 12 is checked. After that, the defect is fixed by replacing the laser module 12, if necessary. In addition, if the output values of the plurality of the photodiodes PD2 are within the predetermined range, whereas the output value of the photodiode PD in the beam combiner 13 is out of the predetermined range, it is possible to determine that a positional displacement of an optical component in the beam combiner 13 occurs. Accordingly, the defect may be fixed by replacing the beam combiner 13, or by positionally adjusting the optical components in the beam combiner 13.

Other Embodiments

According to the first embodiment, the laser oscillator 20 is configured such that the laser beams emitted from the laser modules 12 are combined and emitted as the combined laser beam LB; However, the laser oscillator 20 is not limited to this configuration and may be configured to emit a single laser beam generated in a single laser resonator structure. In this case, the diffusion plate DP and the photodiode PD may be disposed in a separate casing (not shown) different from the casing housing the beam combiner 13. Further, a separate output monitor (not shown) for monitoring the output of the combined laser beam LB emitted from the emission end of the transmission fiber 40 may be arranged in the laser processing device 100. In this case, the output monitor 15 in the light condensing unit 14 may be omitted. The present invention is not limited to the above configurations, and the elements described in connection with the embodiments and variations may be combined with each other, resulting in a new embodiment.

The laser device of the present invention is capable of detecting deviation of an optical axis of a laser beam with a simple configuration, and is therefore useful when applied in a laser device in which a laser beam emitted passes through a plurality of components such as a laser processing device.

DESCRIPTION OF REFERENCE CHARACTERS

10 Laser Device
12 Laser Module
12*a* Optical Waveguide
13 Beam Combiner
13*a* Beam Combining Optical System
14 Light Condensing Unit
15 Output Monitor
16 Optical Unit
20 Laser Oscillator
30 Laser Beam Emitting Head
40 Transmission Fiber
50 Controller
60 Power Supply
70 Display
100 Laser Processing Device
DP Diffusion Plate (Light Deflecting Member) in Beam Combiner 13
LB Combined Laser Beam
LBA Monitoring Laser Beam
LBA1 Monitoring Laser Beam Deflected from Diffusion Plate DP
MD Partially Transmissive Mirror
MD2 Partially Reflective Mirror in Laser Module 12
PD Photodiode (Light Receiver) in Beam Combiner 13
PDa Light Receiving Surface of Photodiode PD
PD2 Photodiode (Separate Light Receiver) in Laser Module 12
W Workpiece

The invention claimed is:

1. A laser device comprising:
a laser oscillator configured to emit a laser beam; and
an optical unit configured to receive the laser beam emitted from the laser oscillator and emit a part of the laser beam outside, wherein:
the optical unit includes: a partially transmissive mirror configured to reflect the part of the laser beam toward the outside and transmit a remaining part of the laser beam; a light deflecting member configured to diffuse the remaining part of the laser beam which has passed through the partially transmissive mirror and deflect the remaining part of the laser beam in a predetermined direction, at a predetermined diffusion angle; and a light receiver configured to: (i) receive the remaining part of the laser beam deflected by the light deflecting member; (ii) generate an electric signal depending on an amount of light received; and (iii) output the electric signal as an output signal;
the laser device is configured such that the predetermined diffusion angle is greater than a diffusion angle of the remaining part of the laser beam incident on the light deflecting member; and
deviation of an optical axis of the laser beam is monitored based on the output signal of the light receiver.

2. The laser device of claim 1, wherein
a light receiving surface of the light receiver has a width equal to or smaller than a half value width of the remaining part of the laser beam deflected by the light deflecting member on the light receiving surface of the light receiver.

3. The laser device of claim 1, wherein
the laser oscillator is configured to stop laser oscillation when a magnitude of the output signal of the light receiver decreases by a predetermined ratio or more with respect to a magnitude of the output signal of the light receiver when the optical axis of the laser beam does not deviate.

4. The laser device of claim 1, wherein
the light receiver is configured to monitor an output of the laser beam.

5. The laser device of claim 1, wherein:
the laser beam is a combined laser beam;
the laser oscillator includes plural laser modules configured to emit plural laser beams, respectively;
the optical unit includes: a beam combiner configured to combine the plural laser beams emitted from the plural laser modules and emit the plural laser beams as the combined laser beam; and a light condensing lens configured to condense the combined laser beam emitted from the beam combiner and emit the combined laser beam to the outside; and
the beam combiner includes: the partially transmissive mirror; the light deflecting member; and the light receiver.

6. The laser device of claim 5, wherein:
each of the plural laser modules includes a separate light receiver configured to monitor an output of one of the plural laser beams to be emitted to the beam combiner; and
each of the plural laser modules is configured to determine a defect location in the laser device by comparing the output signal of the light receiver in the beam combiner with an output signal of the separate light receiver therein.

7. A laser processing device comprising:
the laser device of claim 1;
a transmission fiber that is connected to the laser device and configured to guide the part of the laser beam emitted from the laser device; and
a laser beam emitting head attached to an emission end of the transmission fiber.

8. The laser device of claim 1, wherein
the laser device is configured such that an amount of the deviation of the optical axis of the laser beam is monitored based on a ratio of drop of the output signal of the light receiver with respect to a magnitude of the output signal of the light receiver when the optical axis of the laser beam does not deviate.

\* \* \* \* \*